(12) United States Patent
Marttila

(10) Patent No.: US 10,212,815 B2
(45) Date of Patent: Feb. 19, 2019

(54) LAMINATE INCLUDING CONDUCTIVE CIRCUIT PATTERNS

(71) Applicant: TECNOMAR OY, Espoo (FI)

(72) Inventor: Tom Marttila, Espoo (FI)

(73) Assignee: TECNOMAR OY (FI)

( * ) Notice: Subject to any disclaimer, the term of this patent is extended or adjusted under 35 U.S.C. 154(b) by 539 days.

(21) Appl. No.: 14/724,242

(22) Filed: May 28, 2015

(65) Prior Publication Data

US 2015/0264812 A1  Sep. 17, 2015

Related U.S. Application Data

(62) Division of application No. 12/922,253, filed as application No. PCT/FI2009/050226 on Mar. 25, 2009, now Pat. No. 9,079,382.

(30) Foreign Application Priority Data

Mar. 26, 2008  (FI) ...................................... 20085244

(51) Int. Cl.
*H05K 1/11* (2006.01)
*G08B 13/24* (2006.01)
(Continued)

(52) U.S. Cl.
CPC .............. *H05K 1/115* (2013.01); *B32B 38/10* (2013.01); *G08B 13/244* (2013.01); *H05K 3/046* (2013.01);
(Continued)

(58) Field of Classification Search
CPC .................................................. H05K 3/3452
(Continued)

(56) References Cited

U.S. PATENT DOCUMENTS 5,108,822 A * 4/1992 Imaichi ................. G01S 13/753
                                                      29/592.1
5,656,115 A   8/1997 Tanno et al. .................. 156/270
(Continued)

FOREIGN PATENT DOCUMENTS

DE   40 00 372 A1   7/1991
EP   0 790 123 A2   8/1997
(Continued)

OTHER PUBLICATIONS

International Search Report dated Jun. 17, 2009 in corresponding PCT International Application No. PCT/FI2009/050226.
(Continued)

*Primary Examiner* — Stanley Tso
(74) *Attorney, Agent, or Firm* — Ostrolenk Faber LLP

(57) ABSTRACT

A laminate contains conductive circuit patterns, a substrate material, and an adhesive pattern or other bond. Each conductive circuit pattern and the substrate material are interconnected by the adhesive pattern or other bond, having its size and shape substantially matching the main outlines of each conductive circuit pattern. Each conductive circuit pattern has thin lines and thin interline spaces, patterned on top of the adhesive pattern or other bond by a removal of conductive material, such that the circuit pattern's thin interline spaces may have residues of the adhesive patterns or other bond. Outside the conductive circuit patterns' main outlines, the substrate material is substantially void of an adhesive or other bond, with the exception of edge areas of the main outlines.

3 Claims, 3 Drawing Sheets

(51) Int. Cl.
  *B32B 38/10* (2006.01)
  *H05K 3/04* (2006.01)
  *B32B 37/12* (2006.01)
  *H05K 1/03* (2006.01)
  *H05K 3/02* (2006.01)
  *H05K 3/38* (2006.01)
  *H05K 3/40* (2006.01)

(52) U.S. Cl.
  CPC ... *B32B 37/1292* (2013.01); *B32B 2310/0843* (2013.01); *B32B 2457/08* (2013.01); *H05K 1/0366* (2013.01); *H05K 1/0386* (2013.01); *H05K 3/027* (2013.01); *H05K 3/386* (2013.01); *H05K 3/4084* (2013.01); *H05K 2201/0284* (2013.01); *H05K 2201/0355* (2013.01); *H05K 2203/0522* (2013.01); *H05K 2203/1545* (2013.01); *Y10T 29/49156* (2015.01)

(58) Field of Classification Search
  USPC .......................................................... 174/250
  See application file for complete search history.

(56) References Cited

U.S. PATENT DOCUMENTS

| | | | |
|---|---|---|---|
| 6,161,276 | A | 12/2000 | Droz ............................. 29/602.1 |
| 7,256,738 | B2 | 8/2007 | Uchibori et al. ............. 343/700 |
| 7,497,004 | B2 | 3/2009 | Cote et al. ...................... 29/600 |
| 2002/0053465 | A1* | 5/2002 | Kawakita ............. H05K 3/4069 174/256 |
| 2002/0101155 | A1* | 8/2002 | Kimura ............... H01L 51/5281 313/506 |
| 2003/0051806 | A1 | 3/2003 | Appalucci et al. ........... 156/270 |
| 2004/0112964 | A1* | 6/2004 | Empedocles .......... B82Y 10/00 235/491 |
| 2005/0034995 | A1* | 2/2005 | Gundlach .............. H05K 3/046 205/261 |
| 2005/0018381 | A1 | 8/2005 | Eckstein et al. .............. 156/278 |
| 2007/0020932 | A1 | 1/2007 | Maruyama et al. .......... 438/687 |
| 2007/0102190 | A1 | 5/2007 | Sakamoto ..................... 174/260 |
| 2007/0130754 | A1 | 6/2007 | Fein ................................ 29/600 |
| 2008/0047130 | A1 | 2/2008 | Lin et al. ........................ 29/600 |
| 2009/0056989 | A1* | 3/2009 | Bchir .................. H05K 1/0265 174/256 |

FOREIGN PATENT DOCUMENTS

| | | |
|---|---|---|
| EP | 1 120 796 A2 | 8/2001 |
| GB | 869076 | 5/1961 |
| JP | 58-028895 | 2/1983 |
| JP | 07-100793 | 4/1995 |
| JP | 9-314736 | 12/1997 |
| JP | 2000-515683 | 11/2000 |
| JP | 2001-043328 | 2/2001 |
| JP | 2001-127410 | 5/2001 |
| JP | 2007-103881 | 4/2007 |
| WO | WO 01/54226 A1 | 7/2001 |
| WO | WO 03/024708 A1 | 3/2003 |
| WO | WO 2007/087189 A2 | 8/2007 |
| WO | WO 2007/121115 A2 | 10/2007 |

OTHER PUBLICATIONS

Search Report dated Nov. 18, 2008 in corresponding Finnish Patent Application No. 20085244.

Search Report dated Nov. 28, 2012 in corresponding European Patent Application No. 09724134.3.

English translation of Chinese Office Action dated Dec. 31, 2012 in corresponding Chinese Patent Application No. 200980110823.7.

Notice of Opposition to a European Patent filed on May 13, 2015 against corresponding European Patent No. 2 259 921.

* cited by examiner

LAMINATE INCLUDING CONDUCTIVE CIRCUIT PATTERNS

CROSS REFERENCE TO RELATED APPLICATIONS

This application is a divisional of U.S. patent application Ser. No. 12/922,253, filed Sep. 13, 2010, incorporated herein by reference, which is a 35 U.S.C. § 371 National Phase conversion of International Application No. PCT/FI2009/050226, filed Mar. 25, 2009, which claims benefit of Finnish Application No. 20085244, filed Mar. 26, 2008, the disclosure of which is incorporated herein by reference. The PCT International Application was published in the English language.

The invention relates to a method for manufacturing laminated circuit boards. The method is particularly suitable for manufacturing pliable laminates containing for example RFID antennas.

The method presented in the application lends itself to the manufacture of circuit boards, for example switch circuit boards for keypads, pliable sensor mats and matrices, product tracing tags, antenna units for RFID tags, identification cards and payment cards, components for flexible batteries and solar panels, as well as heating resistances. Subsequently, the invention will be described principally from the standpoint of manufacturing RFID antenna laminates. RFID antenna laminates exist typically as parts of smart tags or can be laminated further to provide part of a thicker structure, for example inside a proximal- or remote-readable payment card.

The product, which is to be manufactured by the method and delivered to a customer or to in-house further processing, is typically a reel which carries the actual RFID antennas at appropriate spacing both laterally and longitudinally of the tape upon a web-like substrate material suitable for further processing and end use of the product. The substrate material consists of an electrically non-conductive windable material, such as paper or plastics, and has generally a thickness of 20-100 µm, typically about 50 µm. The actual antennas consist of an electrically conductive material, such as metal or printing ink containing conductive particles. When the employed electrically conductive material is a metal foil, it generally consists of aluminum or copper and has a thickness of 5-30 µm, typically about 10 µm.

The surface area of conductor patterns in proportion to the entire surface area of an antenna tape is commonly 10-50%, typically 10-30%. The reason for this is that, because of further processing, it is necessary to leave some void space between antenna patterns and that there is surprisingly plenty of non-conductive or void area within the actual antenna patterns. Dealing explicitly with an antenna, such areas must be truly non-conductive, not merely electrically isolated. A consequence of this is that, when the electrically non-conductive material is adjacent to a metal foil, a predominant portion thereof must be removed one way or another during the manufacturing process and just a small portion remains with the finished product. The costs of a removal process are typically determined by the amount of metal to be removed.

What are referred to as products of high security standard, such as passports and credit cards, provide a continuously increasing application field for RFID identifiers. In order to ensure a high level of security, the layer containing an RFID identifier must have a capability of being laminated together with other layers of the same basic material in such a way that the assembly cannot be dismantled without breaking the identifier. This entails that, in the antenna manufacturing process, no adhesive or other impurities at all shall remain on the surface of a base material or shall only appear in a minimal portion of the total surface area.

Many RFID antennas are characterized by their coil-shaped design. In the event that the coil-shaped design is implemented in a planar configuration, the coil's top end and bottom end shall be necessarily located quite far from each other when considering the size of a microchip and, therefore, one end of the coil must be connected electrically with the other end, present on the other side of coil turns, or with a chip attachment zone without having this structure, referred to as a bridge, electrically connected with coil turns existing between its ends. On the other hand, it is sometimes necessary to make efficient use of the surface area allowed for the antenna of an identifier by placing antenna components, for example about a half of the coil-shaped structure, on one side of a common substrate material and by electrically interconnecting this with an antenna component present on the other side.

A further processing step, following the manufacture of antennas, comprises generally the attachment of a microchip. The chip attachment lines used in mass production are designed for processing antennas explicitly in a reel form, and the technology thereof sets high demands on the precision at which the antennas are present on top of the substrate material longitudinally and laterally of the tape. Since the resonance circuit of an EAS or product security tag is not fitted with a chip, the precision demands for its setting are considerably less stringent, although the products, in cursory examination, appear to have quite a few common features as well.

Compared to the resonance circuit of an EAS or product security tag, the manufacturing of an RFID antenna itself must be conducted with much higher precision. First of all, as opposed to a product security tag, the RFID antenna is fitted with a microchip and the chip attachment area includes features, such as void regions referred to as interline spaces, which often have a width of merely 100-200 µm. Secondly, after the attachment of a chip, the antenna and the microchip jointly establish a resonance circuit whose specific frequency must be close enough to the frequency used by a reader to enable a remote reading of data carried in the chip, and the control of resonance frequency requires a high dimensional accuracy of the antenna. Thirdly, the coils of a product security tag generally include just a few turns and in those the lines or conductors and interline spaces are generally just a few millimeters in width, whereas the coils of RFID antennas require about double or triple the number of turns found in the coils of a product security tag often for a highly limited surface area, whereby the width of lines and interline spaces may be an order smaller than what is used in product security tags.

Manufacturing Methods in Common Use

The most commonly applied antenna manufacturing technologies are printing with silver paste and etching of the laminate, and metal plating (electroless plating, electrolytic plating) is also used to some extent. These involve at least the following shortcomings and problems:

1. Printing with silver paste is expensive as the conductive printing ink is expensive. The antenna printed with silver paste is not a solid metallic composition and thereby not particularly good in performance and reliability. The bonding of a microchip to a printed conductor is inconvenient and the joint exhibits often a poor strength.

2. Etching is conducted with a laminate raw material, featuring an uncoated metal foil affixed over its entire area to a plastic substrate material. The product's properties necessitate that a predominant portion of the metal foil be removed, and in this method, it is all dissolved in the etching solution, as a result of which it has a very low, even negative value—at worst it constitutes problem waste. Likewise, the product's properties necessitate the removal of both large continuous areas and very narrow interline spaces, making it more difficult to provide a high product quality, especially at speeds suitable for mass production. After the etching, the substrate material is fully covered with an adhesive coating in areas from which the metal foil has been removed, whereby the product is not qualified for making articles of high security level, such as passports and credit cards. The most effective etching processes are generally only capable of "biting" into a specific metal, thus disallowing product variations. In particular, the effective aluminum etching processes require often the use of a solvent-based resist ink and hence the removal of resist ink also requires the use of solvents, which results in plenty of nuisance from the standpoint of both a product and a production facility. In a major scale, the facility based on such etching usually requires an environmental permit and involves ecological hazards.
3. Processes based on metal plating are wet, thus disallowing the processing of paper-based products. Metal plating requires a seed layer generally made by printing, and such printing inks are expensive. Growing the metal layer to a sufficient thickness is usually quite a slow process. Metal plating is generally only used for making antennas of copper, and copper is an expensive and ecologically hazardous material. Metal plating processes good for aluminum are not in use.
4. Laser vaporization enables providing precise patterns, but laser does not enable a quick removal of metal from an extensive area. For example, the vaporization of a large metal area from a paper-based laminate is difficult without heating the paper too much.

PRIOR ART

Publication GB869076 describes a process, wherein the surface of a sheet material is first provided with an adhesive coating in desired patterns, then a metal-foil coated laminate is pressed into adherence with the sheet material, and finally the sheet material and the laminate are drawn off of each other, whereby the metal foil carried by the laminate adheres to the sheet material in the parts forming the adhesive patterns and comes off the other parts along with the laminate. The process is not suitable for producing RFID antenna laminates, since the layout of patterns based on foil tearing produces a far too inaccurate result.

Publication WO01/54226 discloses a process, which is nearly consistent with the above-cited one and the accuracy of which is not enough for manufacturing for example a chip attachment area or a coil antenna.

Publication US2005/0034995 discloses a process, wherein a metal foil or metal powder is applied to a substrate body either with patterned adhesive or by selectively melting the substrate body, after which a non-bonded portion of the metal foil or powder is removed mechanically, such as especially by brushing.

Publication EP0790123 discloses a method, wherein a laminate is manufactured first by adhesive-bonding a metal foil in its entirety into adherence with a substrate material and then the metal foil is removed from desired areas by means of laser beam evaporation. The same type of method is presented in publication DE4000372, and it may be appropriate for cases in which the foil to be removed represents a small portion of the entire surface area. However, the method lends itself poorly to the mass production of an RFID antenna laminate because, due to the product's properties, a predominant portion of the metal foil must be removed and its removal by laser evaporation is tedious, expensive, and also technically challenging as the substrate material must not be damaged. In addition, an adhesive coating shall remain on the substrate material in areas from which the metal foil has been removed, which is why the product is not suitable for the manufacture of high security level articles, such as passports and credit cards.

The same publication EP0790123 discloses an alternative method of first manufacturing a laminate by applying an adhesive in desired patterns between the substrate material and the laminate, then cutting off the metal foil along an inter-bonding line, and finally removing a cut-off portion of the foil. The method might lend itself well to cases which do not require the production of thin lines and interline spaces, but the method is poorly applicable to the mass production of a typical RFID antenna laminate: The method requires that the cutting of a metal foil be done along a line beyond the edge of an adhesive pattern in order to ensure that the rest of the foil would be certainly off and removable after a cutting operation. The application of an adhesive involves always a certain degree of positional and dimensional inaccuracy and, in addition, the adhesive pattern has often a tendency to spread out upon bonding the materials together, which further increases the positional instability regarding the edge of an adhesive pattern. When this is topped up by the positional and dimensional inaccuracy of a cutting process, it is obvious that the method does not enable the manufacture of typical RFID antennas with narrow interline spaces. Moreover, as a result of what has been described above, the edges of a remaining foil pattern are in practice unavoidably out of contact with the substrate material, which is generally unacceptable within a chip attachment area of the antenna.

Publication US2005/0183817 presents a method highly similar to the one described above: applying adhesive patterns to the surface of a substrate material, then laying a metal foil into contact with the track surface, whereby the foil becomes bonded to the adhesive patterns, then stamping the foil off along the adhesive patterns' edges, and then removing a cut-off portion of the foil. This method has exactly the same weaknesses and limitations as the one described in the preceding paragraph.

A method practically consistent with the preceding ones has been described in publication WO2007/087189 with the difference that, instead of a metal foil alone, it uses a laminate which includes a carrier layer in addition to the metal foil. For the above reasons, it is poorly suitable for manufacturing an RFID antenna laminate, perhaps with the exception of cases in which the antenna comes in a very simple design. A definite majority of RFID antennas are such that antenna laminates containing the same cannot be manufactured with this method. Besides, the use of a laminate in place of a mere metal foil increases manufacturing costs.

Another method highly consistent with the preceding ones has been described in publication WO03/024708. There is no essential difference from the preceding ones, and thereby it has the same limitations and poor adaptability to the mass production of RFID antenna laminates.

Publication JP2001127410A discloses a method of first applying an adhesive all over the surface of a metal foil and then creating non-stickiness on the adhesive coating in parts from which a subsequent removal of the metal foil is desired. When the foil, along with its treated adhesive coating, has been affixed to a substrate material, the foil and the adhesive layer are cut off down to the substrate material, for example by stamping along the lines of the parts treated for non-stickiness, and finally using an adhesive tape for removing the parts treated for non-stickiness. In principle, the method is identical to that described in EP0790123, except for the layout of adhesive patterns.

Publication U.S. Pat. No. 6,161,276 discloses a method, wherein the pattern layout is made on top of an adhesive-coated area using first a stamping die for making cuts through a metal foil down to a substrate material and then opening the cuts by bending the laminate and filling the opened cuts with a dielectric filler. The method may lend itself well to cases, which do not require the production of thin line pitches and interline spaces and in which a chip can be attached to an antenna, and the antenna, along with its chip, can be laminated for a part of the inflexible structure in the same manufacturing process as the one used for making the antenna, but the method is poorly suitable for the mass production of a typical RFID antenna laminate: Because of the tool, stamping can only be used for manufacturing such antennas in which the line pitch is quite large. Making even a simple RFID chip attachment area is impossible because, first of all, the open-bent and dielectric-filled cut results in the attachment area becoming convex and, secondly, it is practically impossible to apply a dielectric in such a way that it would not spread over those foil surfaces to which the chip is to be electrically bonded. More complex chip attachment areas, including several electrically isolated surfaces, cannot be manufactured at all. In addition, one of the main features of the process according to the cited publication is that, because of a stamping operation, the foil surface must be provided with a synthetic film which would have to be removed at least from RFID antennas in preparation for further processing, and all this increases complexity and costs of the process.

Publication WO2007/121115 presents a method, wherein a metal foil is applied in its entirety to a carrier web, such that the adhesive bond is releasable, the metal foil is die-cut with stamping rolls, then the adhesive bond is removed by breaking off a scrap portion of the metal foil, and finally the prepared patterns are also transferred to a desired part of the end product by breaking the adhesive bond.

Publication U.S. Pat. No. 7,256,738 discloses a method, wherein a metal foil coated in its entirety with a hot-melt adhesive is stamped to remove desired patterns therefrom in a nip in which one roll is a stamping roll and the other is a transfer roll, and then the stamped-off patterns proceed by way of one or more transfer rolls onto the surface of a substrate material for finally securing the same—by melting the hot-melt adhesive—thereto. This method involves limitations similar to the preceding method and, thus, it is not generally applicable to the mass production of an RFID antenna laminate.

The above-cited methods cannot be used in mass production for the manufacture of chip-carrying RFID tags.

OBJECTIVE OF THE INVENTION

It is an objective of the invention to manufacture conductor-patterned circuit board laminate for providing a precisely defined and even thin interline-spaces featuring pattern layout in a more readily controlled and more efficient process, even in the event that the pattern layout contains extensive areas without conductors, and for avoiding the problems caused by an adhesive coating left in the non-conductive area in the process of laminating security articles. Another objective of the invention is the economically viable and reliable manufacture of electric circuits to be placed on either side of a substrate material. A further objective is to reduce the amount of manufacturing-produced hard-to-recycle scrap and to encourage the recycling and reuse of materials. A still further objective is to enable the use of a laser in the manufacture of a coil-antenna equipped circuit board also in relation to thermal paper, without restricting the production rate.

DESCRIPTION OF THE INVENTION

The invention will be described with the aid of the accompanying drawings.

Figure 1A:
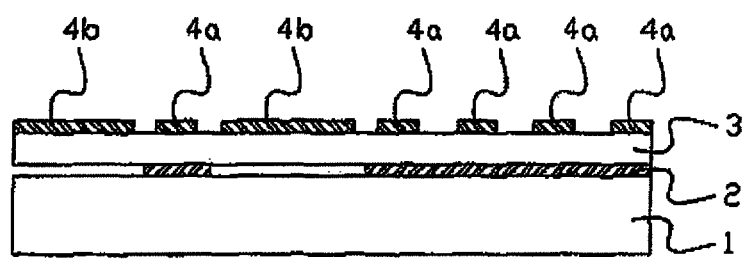
FIGS. 1a and 1b show process steps in a working example by etching.

In all figures, the reference numerals are designated as follows:
1 substrate material
2 patterned adhesive or other bonding
3 metal foil
3a conductor in a completed circuit board
3b piece of metal foil to be removed FIG. 1a illustrates a blank with an adhesive applied according to the invention prior to etching. On top of a metal foil 3 has been applied an etching resist, the metal in the area covered thereby not eroding away in the etching process. Between a substrate material 1 and the metal foil 3 has been applied an adhesive 2 by spreading adhesive under resist patterns 4a forming the final conductor patterns and by spreading adhesive also slightly beyond the areas 4a. The right-hand flank comprises several side-by-side resist patterns 4a close to each other, and in areas straddled by these patterns the metal foil 3 has been adhesive-bonded in its entirety to the substrate material 1. In the middle and on the left-hand flank there are extensive areas, in which no conductors shall be provided, and in a matching relationship with these areas have been applied resist patterns 4b, under which there has not been applied any adhesive between the substrate material 1 and the metal foil 3.

Figure 1B:
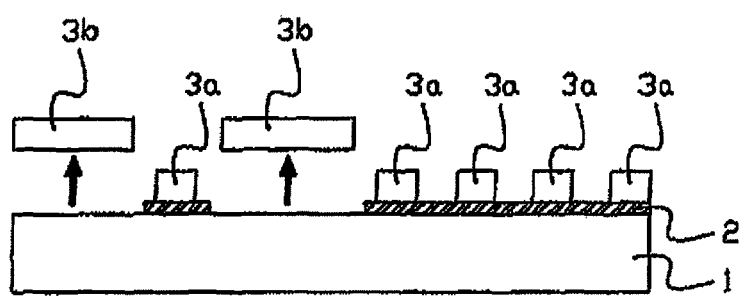

Etching removes the parts of a metal foil not protected by an etching resist, and the post-etching end result is consistent with FIG. 1b. On the right-hand flank are several side-by-side conductor patterns 3a defined by the resist patterns 4a, the etching process has opened up narrow inter-conductor spaces, and the narrow inter-conductor spaces are left with an exposed adhesive layer 2. In the middle and on the left-hand flank, the etching process has released metal foil parts 3b, which are protected by the resist patterns 4b and which can be removed in a solid metallic state, not being adhesive-bonded to the substrate material 1. In such a procedure, the adhesion is not subjected to high-precision regulations regarding accuracy, matching alignment, and line width, and the etching process can in turn be optimized to only remove narrow strips at high precision, whereby the quality produced thereby is better and less metal is dissolved in the etching solution, thus minimizing the need of fresh etching solution and the formation of spent etching solution.

At the same time, a predominant portion of removable metal foils is stripped off in a metallic state, making it recyclable and reusable. Furthermore, a predominant portion of the surface becoming exposed from under the removable metal foil is adhesive-free with no restrictions for further processing of the product.

It should be noted that the resist has not been sketched or has been removed in FIG. 1b. In reality, there is probably no need for removing the resist prior to recycling the pieces 3b, because a normal organic resist burns harmlessly in the course of a metal melting process. Some resists may function also as a flux or a barrier lacquer in subsequent production steps and, hence, need not be removed from the product prior to further processing.

Figure 2A:
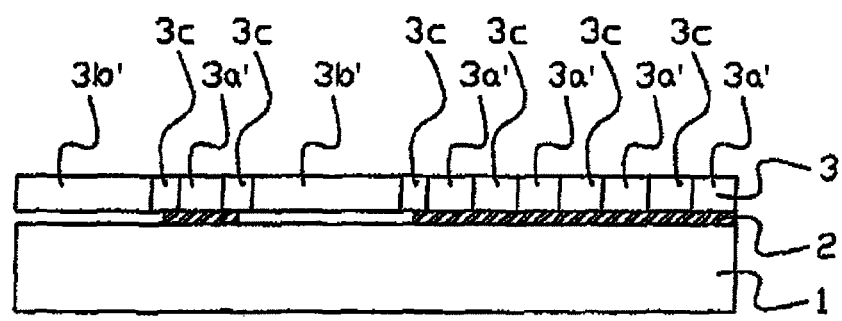
FIGS. 2a and 2b show process steps in a working example by vaporization.
Figure 2B:
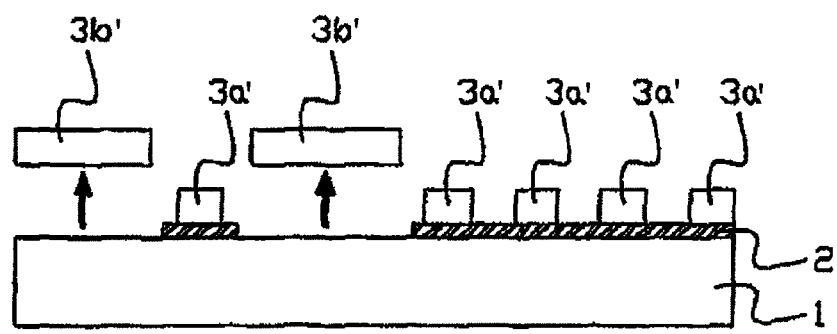

FIG. 2a depicts a similar initial condition as the removal of areas 3c is performed by means of laser vaporization, and FIG. 2b shows the situation after vaporization. With regard to densely disposed conductors, the obtained benefits in this case are equal to those gained in the etching process, i.e. the attainable patterning precision is only affected by the accuracy of a laser operation, not by the accuracy of adhesive bonding. Because the portion 3b' is not adhesive-secured to the substrate, it need not be vaporized in its entirety, but just the narrow areas 3c around it must be vaporized away. As a result, the process speeds up considerably and a predominant portion of the removable metal foils is removed in a metallic state, making it recyclable and reusable. Furthermore, a predominant portion of the surface unveiling from under the removable metal foil is adhesive-free, thus presenting no restrictions in terms of further processing of the product. It should be appreciated that the laser operation may also penetrate into the adhesive or other bonding layer or even through such layer into the substrate material, but this does not nullify benefits gained by the method and thereby still constitutes an embodiment of this method.

Stamping can be used for patterning circuit boards, as disclosed in the cited prior art references. In tests, however, a reliable and sufficiently precise pattern layout was not achieved by stamping. The problems encountered in practice were the same as previously described in the above-cited reference publications. If no material is removed from narrow dielectric patterns, there will be short circuits developing upon the return of a plastic strain and the surface will be rough or dielectric fillings will be required. If material is removed from dielectric gaps during the course of a stamping process by tearing or by making two cuts to slice off a strip of metal, a sufficiently small line width shall not be achieved, because the removal necessitates the omission of an adhesive coating from the area to be removed and two die-stamping operations on either side of the area to be removed. Consequently, the stamping process could not be managed to function, at least not as the only patterning method of a conductor layer, but there is required a material removing patterning process from the top of a bonding layer for patterning small interline spaces.

Various patterning methods can be combined with each other: it is possible to use for example a laser operation for releasing extra areas 3b prior to etching or even before the application of an etching resist. The removable areas 3b can be released as early as prior to etching, and partially or totally adhesive-secured edge regions come off at a high dimensional accuracy during the course of an etching process. On the other hand, it is possible to laser-prepare chip attachment areas for antennas otherwise manufactured by etching.

The attachment of a metal foil 3 and the patterning of an attachment can be conducted not only by applying the adhesive on a desired area for example by a stencil or ink-jet technique but also, for example, by using a UV-curing adhesive which, after the application, is set in the region desired to be left unattached. Then, the metal foil 3 is pressed to a firm contact with the substrate material 1 and the leftover adhesive is cured by exposure to light through the substrate material from behind the metal foil 3. The attachment patterning can be further performed by heating and melting the plastic material, for example a polyolefin film, in a patterned fashion between the metal foil and the substrate material. Another possibility is to employ a pressure-activated adhesive. The pressure-activated adhesive may contain breakable microcapsules, which only activate the adhesive in areas subjected to pressure. It is further possible to conduct the patterning by using a deactivating layer, which can be for example a soluble or melting layer under the metal-plated layer or the adhesive-bonded layer, whereby the adhesive or the metal layer does not adhere to the substrate material within the area of the deactivating layer.

Figure 3A:
FIGS. 3a, 3b and 3c show the manufacture of an electrical circuit set on either side of a substrate material.

In FIG. 3a a manufacturing step is depicted for a double-sided circuit board laminate implementable by a method of the invention, in which the substrate material 1 has been provided with holes 5 in such locations that, as the manufacturing process progresses, the holes will be covered partially or completely by conductors 3a made from a metal foil. In the process step shown in FIG. 3a, the holes 5 extend also through a patterned adhesive or other attachment 2, which means that either the patterned adhesive or other bonding 2 has been on top of the substrate material 1 even before the holes 5 were made and the hole-making process has produced holes through the substrate material 1 and the patterned adhesive or other bonding 2 at the same time or the holes 5 have only been made in the substrate material 1, after which the patterned adhesive or other bonding 2 has been laid on a surface of the substrate material 1 in a manner neither blocking nor concealing the holes 5. At this point, the patterned adhesive or other bonding 2 can be present either on one side or both sides of the substrate material 1, being shown in FIG. 3a on just one side.

Figure 3B:
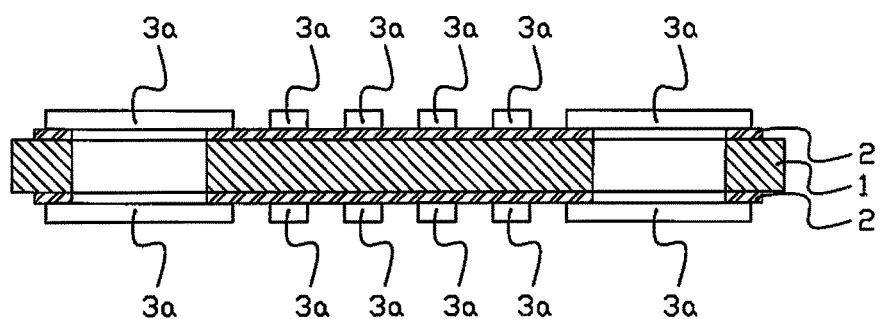

In FIG. 3b a manufacturing step is depicted for an electric circuit set on either side of a substrate material, in which the substrate material 1 is provided on either side with conductors 3a made from a metal foil. FIG. 3b shows a condition, in which the holes 5 are completely covered by the conductors 3a, but it is conceivable that the holes be only partially concealed by the conductors. At least, whenever the patterning of a metal foil is effected by etching, it is preferred that the holes 5 be completely covered by the conductors 3a as this way the hole 5 constitutes a closed space and the etching solution has no access to its interior. It is also possible that the conductors 3a be made of a metal foil for just one side of the substrate material 1 and on the other side of the substrate material 1 is laid a conducting composition of some other material, for example a conductive printing ink.

Figure 3C:
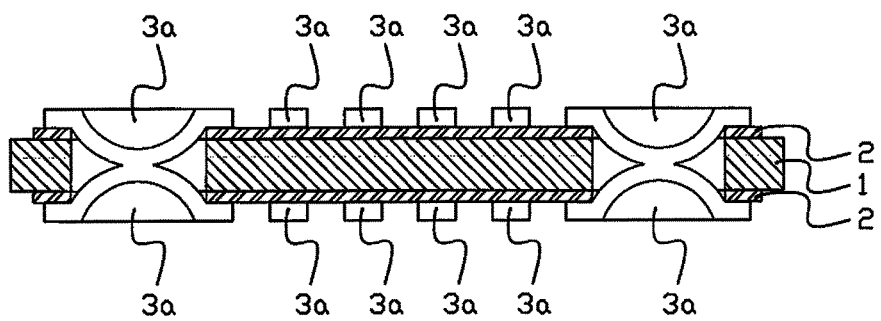

In FIG. 3c a completed electric circuit is depicted mounted on either side of a substrate material as the conductors 3a, made from a metal foil and present on either side of the substrate material 1 in a matching relationship with the holes 5, are connected electrically to each other by spot or ultrasonic welding or another like method through the holes 5. The conductors 3a can be connected electrically to each other also in many other ways, such as for example by filling the holes 5, opened on one or both sides or only partially covered by the conductors 3a, with a conductive printing ink or some other material. In the event that a metal foil is only used for making the conductors 3a on just one side of the substrate material 1 and a conductive composition is made on the other side of the substrate material 1 from some other material, such as for example a conductive printing ink, the latter's electrical connection to the conductors 3a of metal foil through the holes 5 can be established as part of its manufacturing process without a separate connecting step.

It should be noted that all figures only represent principles instead of being shown in scale. This is particularly obvious in reference to FIG. 3c, wherein the electrical interconnection of conductors in metal foil design has made the conductors 3a convex with a very small radius. In real dimensions, the hole 5 can have a diameter which is made significantly larger than the thickness of a substrate material 1, the conductors 3a requiring a lot less bending and stretching than what is shown in FIG. 3c.

The penetration to be passed through a hole during the course of a selective adhesive bonding or metal foil bonding process is preferably made in such a way that the hole-surrounding foil is free of adhesive or bonding at least from some directions. Thus, the foil, connecting this way through a hole, is able to adapt itself through the hole better than a foil which is bonded around its whole periphery. In addition, the selective adhesive bonding enables establishing in the proximity of the connection a flexible area which is free of substrate material. The above-described penetration technique finds applications also in other fields of pattern design conducted by means of selective use of adhesive or bonding.

At least when using laser patterning, it is easy to design, according to the invention, conductor areas, which at least around the penetration are free of adhesive bonding and which can be further connected through a circuit board as described above. If the patterning is made by etching, the back surface of a foil can be coated before bonding to the substrate material. The stamping or cutting process can also be used for making a pattern layout for penetration. The looseness of a conductor present alongside the connection may facilitate a soldering or gluing process of the penetration, because an adhesive-free gap between the strip and the circuit board laminate may function as a capillary element and thereby bring together the surfaces to be glued. The foil, left unglued in the surrounding vicinity of a hole, enables also a penetration even through a laminate of quite a considerable thickness, because this way the foil is able to adapt itself for passing through the hole without having to stretch too much. In the event that the portion of a foil left unglued is formed with appropriate, flexure-allowing profile cuts, which are not adhesive-bonded firmly to the substrate material, in order to establish a connection, the foil can be pressed through a laminate of almost arbitrary thickness for example during the course of an ultrasonic welding process. The foil can also be cut loose from three directions or left attached only by weak fasteners, which are allowed to break in a connecting process.

The unglued conductor bridges can also be used for constructing fuses or the configuration of a circuit can be implemented by making breakable bridges which can be present on top of a hole in the circuit board, the breaking being performed by pressing the bridge to snap it off at the point coincident with the hole. Breaking outside the hole is performed by scraping or cutting. In this case, the bridge has a shape that makes it easy to snap off at both of its ends and thus allows its complete removal. For example, the bridge can be perforated at its ends and the removable section may include for example an enlargement provided with holes by way of which the tip of a tool can take a grip on the removable part. Loose metal bridges can also be used as a blocking or signaling connection, for example in the context of disabling a tag, the conductor patterns unglued to the substrate material being made easily breakable for example in the engagement with the adhesive surface of a wrist-bonding RFID tag, whereby tearing off the adhesive bond causes a very difficult-to-mend disruption of the conductors. Thus, the result is a more-than-before reliable adhesive-bondable RFID seal. The breakable conductors can also be present between two laminate layers, and tearing off the tag disrupts the conductors from inside, thus providing a better protection for the conductors, for example against corrosion.

A loose metal foil can also be cut by means of laser so as to enable its folding onto one side of a hole or a board edge. In practice, this involves making beforehand a hole which, upon cutting the circuit boards to their final shape, appears in the form of a recess at the edge of a circuit board and, thus, as a result of such cutting, the metal foil falls shorter than the circuit board by the extent of said recess and hence is not very susceptible to damage. This enables providing strips for joints along the outer edge of a board. These strips can be used as a penetration or can be affixed outside the circuit board, for example by means of ultrasonic welding or by soldering.

Embodiments of the Invention

The method according to the invention is used for manufacturing conductors in a metal foil design for an RFID antenna laminate as follows:

1. A substrate material 1 and a metal foil 3 are processed for a laminate, in which the substrate material 1 and the metal foil 3 are in a secure attachment with each other, essentially in areas matching the dimensions, shapes and layout of patterns to be prepared. The bond is allowed to form across areas featuring thin lines and interline spaces—the boundaries of bonds are thus allowed to match "the main outlines" of patterns to be prepared, whereby establishing a patterned bond is easy with prior known methods. For example, with regard to an HF antenna coil, the bond is allowed to form not only in the area of conductors but also in spaces therebetween, whereby the bond is the form of quite a wide ring-like pattern without narrow gaps.
2. The above-described laminate is patterned in such a way that the pattern layout is applied to areas bonded to each other in the preceding step for example by means of an adhesive 2 and that the pattern layout penetrates at least through the metal foil 3. The patterning is carried out by using one or more methods capable of removing material from the metal foil in a state other than solid metal instead of just cutting it off without removing material. The removal of material can be performed by using for example an etching, lasering, ion jet or particle blasting process. The patterning is used for preparing both an intra-pattern layout—for example narrow inter-conductor gaps for an HF antenna coil—on top of the bond and pattern outlines on top of or outside the bond. The position and width of patterning the outlines are set in such a way that the bond interconnecting a substrate material and a metal foil has its edge either inside or alongside the area of the foil to be removed by patterning, whereby the patterning of outlines at the same time releases the extra-bond portion of the foil from the rest of the foil. When the patterning of outlines is set in such a way that the bond has its edge inside the area to be removed by patterning, the foil pattern to be prepared has all its edges completely in attachment with the substrate material. The bond surface possibly remaining exposed after the patterning process—both inside and possibly around the pattern—is so negligible in area that the product lends itself to the manufacture of high level security articles, such as passports and credit cards, even if the bond had been made by gluing.

3. A portion 3b of the foil, released by virtue of a patterning process, is removed in a solid metallic state, thus providing a finished laminate featuring conductive patterns 3a. If the patterning process is conducted by etching, it is possibly necessary to remove the etching resist prior to further use.

Which portion of the metal foil is removed by a patterning process in a state other than solid metal as the patterning is conducted for example by etching or laser vaporization or by otherwise working, and which portion of the metal foil is removed in a solid metallic state, depends on methods selected for bond formation and patterning processes, on their resolutions, and on the precision of alignment therebetween. For example, when the patterning is performed by etching, it is often desirable not to have very small loose fragments of metal foil in the etching solution, whereby it may be advisable to use etching for the removal of areas even several millimeters in width. On the other hand, if the patterning is performed by using a laser, it is often advisable to remove a middle portion in a solid metallic state from areas having a width of more than two laser beam diameters—for example, if the beam has a diameter of 100 μm, it may be advisable to have a middle portion of all areas more than 200 μm in width removed in a solid metallic state.

In practice, it is the patterning accuracy of an adhesive area which defines the smallest preferred width for a metallic area to be cut off by laser vaporization, it being typically advisable, when using laser, to remove in a metallic state also areas clearly less than a millimeter in width, while the removal of a narrow area by etching does not yield a similar benefit because the small released fragments dissolve in any event in the etching solution before the salvage thereof can be managed from the solution, thus not achieving any notable benefit.

For the manufacture of a pattern-specifically bonded laminate (main step 1), there are a number of prior known methods, such as for example:

The laminate can be manufactured by applying an adhesive selectively by using for example a printing process, such as gravure or flexographic printing, or an output method, such as ink-jet output.

The laminate can be manufactured by applying an adhesive such as for example—the chip attachment method permitting—a hot-melt adhesive comprehensively (non-selectively) for example to the surface of a metal foil and by activating it selectively for example by heating. Another possibility is to deactivate the adhesive of a releasable foil portion prior to gluing, for example an ultraviolet-curing adhesive can be set prior to lamination and the area to be adhesive-bonded through the backing material can be cured after the on-pressing of a metal foil by irradiating the adhesive through the backing material.

In some cases, the laminate can be manufactured without additives by using a substrate material, which in itself can be managed to adhere to a foil selectively, for example by heating areas over which the adherence is desired.

Since it is not necessary in a method of the invention to pattern a bond according to small interline spaces present in patterns to be prepared, but the bond is allowed to form also at such spaces, the manufacture of a laminate necessitated by the method is an easy process.

In order to pattern the metal foil 3 included in a pattern-specifically bonded laminate (main step 2), there are also several methods capable of removing material in a state other than solid metal, for example:

Patterning is performed by etching. In a method of the invention, a majority of the foil surface can be protected by an etching resist, just the interline spaces matching the internal features of patterns to be prepared and the narrow areas around the patterns must be left exposed (FIG. 1a) for eroding the foil away from these areas. Consequently, the portion of foil to be dissolved in the etching solution falls to a fraction of what it is in the above-described currently used etching process and most of the foil to be removed is loose after etching and removable in a foil form (FIG. 1b). This provides immediately a number of major benefits, for example: a) the consumption of an etching solution and the yield and the waste disposal cost of a metal-containing etching solution are minimized, b) a predominant portion of the removable metal foil departs in a foil form, having the value of scrap metal, c) the etching process only functions to dissolve narrow areas, whereby the process can be optimized for this purpose, thus maximizing the product quality and production rate, and d) after the etching process, the substrate material has a bond surface uncovered in just a very small portion of the surface area, whereby the product is qualified for the manufacture of high security level articles, such as passports and credit cards. Because the portion of foil to be dissolved falls to a fraction, it is possible, also in the etching of aluminum, to make use of processes not necessitating the use of solvents, and it is also possible to select such processes that one and the same etching line can be used for etching both aluminum and copper. The minimized amount of removable metal provides also a possibility of utilizing dry etching processes, enabling the use of inexpensive and ecological paper as a substrate material for the antenna laminate. Since etching removes material from a metal foil instead of just cutting it off the way of a stamping process, for example, the patterning made by etching need not be filled with any dielectric substance, the patterned laminate made by etching is planar and dimensionally precise, and the etching enables making accurate and even intricate details, such as RFID chip attachment areas. Since the patterning made by etching does not induce blistering of the laminate, on the other side of one and the same substrate material can be formed an electric circuit by using the same or some other method. The inter-conductor gaps made by etching are typically all the way wider than the thickness of a metal foil, whereby there is no hazard of electric breakdown and the capacitance is low between conductors, and the width of inter-conductor gaps can be selected and adjusted freely by etching for optimizing the electrical properties and reliability of an electric circuit.

Patterning can performed with a laser beam. In a method of the invention, a majority of the foil surface can be left non-vaporized, just the interline spaces matching the internal features of patterns to be prepared and the narrow areas around the patterns shall be vaporized (FIG. 2a). Consequently, the portion of foil to be vaporized falls to a fraction of what it is in prior known patterning processes, which provides a number of immediate benefits, for example: a) the process rate is maximized, b) the power demand and energy consumption are minimized, c) the risk of damage to the substrate material is minimized, d) almost all of the removable metal is still in a foil state, having the value of scrap metal (FIG. 2b), and e) after the laser operation, the substrate material has a bond surface exposed not more than in a very small portion of the surface area, whereby the product is qualified for the manufacture of high security level articles, such as passports and credit cards. On the other hand, as opposed to prior known processes in which the foil is cut off with a laser in compliance with the contours of a bond pattern, the process according to the invention offers at least the following obvious benefits: a) the process according to the invention is capable of producing extremely thin lines and interline spaces, because the patterning is made on top of the bond instead of following the contours of a bond, b) because the patterning that requires maximum accuracy is made on top of the bond, the edges of a foil in these areas are secured by the bond to the substrate material, which is often absolutely necessary for the attachment of a chip, and c) the precision requirements regarding a bond and patterning as such and relative to each other are on a level which is easy to attain and sustain with modern methods in the mass production of an antenna laminate. The laser procedure is inherently a dry process, whereby the substrate material of an antenna laminate may even consist of inexpensive and ecological paper. Because vaporization removes material from a metal foil instead of cutting it off by way of deformation, such as for example stamping, the patterning made by vaporization need not be filled with any dielectric substance, the patterned laminate made by vaporization is planar and dimensionally accurate, and the vaporization process is capable of producing exact and even intricate details, such as RFID chip attachment areas. Because the patterning made by vaporization does not induce blistering of the laminate, on the other side of one and the same substrate material can be formed an electric circuit by using the same or some other method. The inter-conductor gaps made by vaporization are typically all the way wider than the thickness of a metal foil, whereby there is no hazard of electric breakdown and the capacitance is low between conductors, and the width of inter-conductor gaps can be selected and adjusted arbitrarily by vaporization for optimizing the electrical properties and reliability of an electric circuit.

For the removal in a solid metallic state of a foil portion released by virtue of patterning (main step 3) there are several prior known methods. The released portion can be removed in a dry condition for example by suction with a nozzle, a suction roll or mat. In an etching process, the loosening of foil fragments can be facilitated by using for example bubbling or suction. The gathering of released foil fragments can be performed by using for example bottom-scraping or belt-driven collectors or a sufficiently high flow rate, enabling the gathering by straining the fragments from liquid. The liquid to be strained can be "vacuumed" from the proximity of a laminate to be etched for straining, whereby the released fragments of metal foil spend as brief a time as possible in the etching solution and the wasteful corrosion remains insignificant. The continuous cleaning of a strainer is managed by designing the strainer as a web, which functions at the same time as a conveyor belt for the released fragments. A prior known simple way of vacuuming debris from liquid is to employ an ejector pump or a pumping process operating by means of rising gas bubbles. If necessary, the size of releasing foil pieces can be made smaller by leaving narrow gaps in a resist layer to be pressed in a matching relationship with the area to be released, said area being fragmented by etching for smaller pieces, or larger areas and pieces can be made into smaller fragments by using a laser. Shaping of the bond or the resist pattern can also be used for totally preventing the release of removable portions during a patterning process, such portions emerging along with the laminate out of the patterning process and being removable for example by suction with a nozzle, a suction roll or mat. After the removal, the foil can be for example chopped and baled for easy delivery to a scrap dealer.

When the laminate is manufactured by gluing, the application and patterning of an adhesive can be conducted in a computer-controlled manner with no need for antenna-pattern specific tools, such as printing surfaces, as the construction of laminate proceeds instead on the basis of data fed into the device. In this context, it is possible to use for example piezoelectric or thermal jet-ink output technology, providing benefits over traditional laminating and printing methods at least as follows: a) it is inherently numerically controlled with no need for any antenna-pattern specific tool, such as a printing surface, b) it has an excellent output and reproduction accuracy, nor is it subject to wearing—the shape and position of output patterns remain the same even over a long output cycle, c) it enables a precise setting and standardization of the thickness of an output adhesive layer, whereby the possible spreading of adhesive in the process of bringing the webs together, and other thickness-related properties of an adhesive bond, can be precisely controlled, and d) the system is inherently substantially closed, which offers possibilities of using adhesives totally different from each other. The ink jet is highly suitable for roll-to-roll manufacturing.

When the patterning of a foil is made by etching, the ink-jet technology can be used for outputting not only an adhesive but also an etching resist, thus providing the application of a resist with the same benefit as the application of an adhesive, and the entire process can be conducted without antenna-pattern specific tools and the product is completed all the way to the finish on the basis of data fed into the devices.

When the patterning is effected by using a laser, the patterning will proceed inherently under the control of a computer. If, in this case, the laminate manufacturing is effected by using a computer-controlled adhesive output, the product will be completed all the way to the finish on the basis of data fed into the devices.

A laminate manufactured by a method of the invention is characterized in that a) a substrate material and metal foil patterns are coupled together by adhesive patterns or other bonds, the size and shape of which are more or less consistent with the main outlines of antenna patterns, b) the antenna patterns have internal precise patterns designs thereof (thin lines and interspaces) patterned on top of or through the adhesive layer or other bond, and c) outside the antenna patterns' main outlines the substrate material is totally or almost totally void of adhesive or other bond. Thus, extensive conductor-free areas are void of a bonding agent, and narrow inter-conductor gaps have a bonding agent therein or have been otherwise attached during the patterning of a conductor, such that the contours of conductor patterns are in contact with the laminate and residues of adhesive or other bond may only be left in the proximity of the contours of inter-conductor patterns and in the inter-pattern spaces.

In a method of the invention, the manufacturing of an electric circuit mounted on either side of a substrate material proceeds as follows:

1. A substrate material 1 is provided with holes 5 in such positions that, as the manufacturing progresses, the holes are covered partly or completely by conductors 3a made from a metal foil. In the event that an adhesive is used in the process of bonding a metal foil 3 and the substrate material 1, the holes 5 can be made, after the adhesive has been applied, also by penetrating the adhesive layer, or the adhesive can be applied after the hole-making process, such that the adhesive does not block or cover the holes 5. The hole can have at least on one side its surrounding vicinity left void of adhesive for providing the metal foil with more deformation tolerance upon pressing the foil through the laminate in a connecting step. In the event that an adhesive is used in the bonding process of the metal foil 3 and the substrate material 1, and in the event that the conductors 3a for either side of the substrate material 1 are made from a metal foil, the adhesive layers for various sides of the substrate material 1 can be made either simultaneously or non-simultaneously.

2. The substrate material 1 and the metal foil 3 are processed to form a laminate, in which the substrate material 1 and the metal foil 3 are in a secure attachment with each other essentially with regard to areas matching the dimensions, shapes and layout of patterns to be prepared. The bond is allowed to develop across the areas featuring thin lines and interline spaces —the contours of bonds are thus allowed to follow "the main outlines" of patterns to be prepared, whereby the formation of a patterned bond is easy with prior known methods. For example, in the case of an HF antenna coil, the bond is allowed to form not only in the area of conductors but also in the gaps therebetween, whereby the bond is quite a wide ring-like pattern without narrow gaps. The bond is established in such a way that, in the vicinity of the holes 5, the metal foil 3 does not become soiled by adhesive or other material but its substrate-material facing surface remains uncovered and clean in locations matching the holes 5. In the event that both sides of the substrate material 1 are provided with conductors 3a made from a metal foil, the metal foils 3 can be bonded to the substrate material either simultaneously or non-simultaneously.

3. The above-described laminate is patterned in such a way that the pattern layout is set in a matching relationship with areas bonded together in the preceding step for example by an adhesive 2, and the pattern layout penetrates at least through the metal foil 3. The patterning is performed by using one or more methods capable of removing material from a metal foil in a state other than solid metal instead of just cutting it off. The patterning is used for establishing both an intra-pattern layout—for example narrow inter-conductor gaps for an HF antenna coil—on top of the bond, and pattern outlines on top of or outside the bond. The patterning for outlines has its position and width set in such a way that the edge of a bond interconnecting the substrate material and the metal foil is located either inside or alongside the area to be removed by patterning, whereby the patterning of outlines releases at the same time the extra-bond foil part from the rest of the foil. When the patterning of outlines is set in such a way that the bond has its edge inside the area to be removed by patterning, the foil pattern to be produced has all its edges all the way in attachment with the substrate material. The bond surface—both inside and possibly around the pattern—possibly remaining uncovered after the patterning process, is sufficiently insignificant in area for making the product qualified for manufacturing high security level articles, such as passports and credit cards, even if the bond had been made by gluing. In case the conductors 3a for either side of the substrate material 1 are made from a metal foil and in case the patterning is made by using an etching process, it is advisable that the metal foils present on either side of the substrate material 1 be etched simultaneously. When using an etching process, it is also preferred to select a geometry in which the conductors 3a cover the holes 5 completely, because this way the hole 5 develops a closed space and the etching solution is denied access therein. In case the conductors 3a for either side of the substrate material 1 are made from a metal foil and the patterning is performed by a laser, the metal foils 3 can be patterned either simultaneously or non-simultaneously.

4. A foil part 3b, released by virtue of patterning, is removed in a solid metallic state. If the patterning is performed by etching, the etching resist must possibly be removed prior to further use. If the conductors 3a for either side of the substrate material 1 are made from a metal foil and the patterning is performed by a laser, the released foil parts 3b can be removed from various sides of the substrate material 1 either simultaneously or non-simultaneously.

5. What is essential in the process of manufacturing an electric circuit mounted on either side of a substrate material is that parts of the electric circuit present on various sides of the substrate material 1 connect or are connected electrically to each other by way of holes 5 made in the substrate material. If the conductors 3a for either side of the substrate material 1 are made from a metal foil, the conductors 3a present on various sides of the substrate material 1 can be connected electrically to each other for example by spot or ultrasonic welding through the holes 5. The conductors 3a made from a foil can also be connected electrically to each other by filling the hole 5 with a conductive material, such as a printing ink, either by first opening the hole partway or completely either from one or both sides either in a patterning process or later or by using a geometry in which the holes 5 are not completely covered by the conductors 3a either from one or both sides of the substrate material 1. In case a metal foil is used for making the conductors 3a for just one side of the substrate material 1 and a conducting layout is made for the other side of the substrate material from some other material, such as for example a conductive printing ink, the latter's electrical connection to the conductors 3a of metal foil design can be established by way of the holes 5 as a part of its manufacturing process, without a separate connecting step.

There are a number of prior known methods for perforating a substrate material and adhesive patterns possibly existing already on its surface or surfaces (main step 1). Perforating can be done preferably with a laser, enabling the perforation of a substrate material in a computer-controlled manner without any type of tool preparation or mechanical setting. Being a non-contact method, the laser is highly suitable for operations in which the perforation occurs after the application of adhesive patterns. Perforation can also be done mechanically, especially when the perforation is performed before the application of adhesive patterns. Various optional implementations of the main steps 2, 3 and 4, along with benefits gained thereby, have already been described above, and various options for performing the main step 5 have been presented in the description of this particular main step.

A method of the invention for manufacturing an electric circuit mounted on either side of a substrate material, in combination with a process of making the conductors for either side of the substrate material from a metal foil, offers a highly beneficial solution for applications in which the end product is required to have a high reliability or a long service life or an adaptability to particularly harsh conditions: When the conductors of metal foil design, present on various sides of a substrate material, are interconnected for example by spot or ultrasonic welding, between the same develops a metallurgical bond, which consists of a single material and which is very durable both mechanically and chemically. In applications less demanding, and particularly in cases where all that is needed on one side of a substrate material is a bridge for electrically interconnecting various components of a coil type antenna structure of metal foil design present on the opposite side, the method according to the invention offers a highly straightforward and cost-effective option: The holes are filled partially or completely with a conductive printing ink or the like material, which is also used for making on the back surface of a substrate material an area electrically interlinking the filled holes. Consequently, the substrate material works as an effective and reliable dielectric between a part of the bridge present on the back surface and conductors extending on the front surface between conductors interlinked by the holes, by virtue of a relatively large thickness of the substrate material, the capacitance between the bridge portion present on the back surface and the conductors extending on the front surface between conductors interlinked by the holes remains low, and furthermore there is completely avoided the equipment and material cost incurred by the process of making a dielectric layer, which is required under a bridge constructed over the conductors. The gluing and patterning method according to the invention enables providing structural conductor designs increasing flexibility in association with a penetration, for example a reticular perforation in the form of cuts or a meander pattern. This enables making a penetration, for example by welding, even through a laminate of considerable thickness. A penetration can also be made between two inter-attached or -glued circuit boards or other conductive material. This enables making an electrical connection also with a laminate-mounted component, even with the backing side of a conductor pattern.

With regard to prior art technology of stamping or cutting, it has been concluded that, by stamping and tearing a non-permanent adhesive bonding, it is not possible to provide a reliably working RF-id tag, having a small space between the legs of a microcircuit. In practice, even with permanent adhesive-bonding, it was not possible to establish reliable patterning. Moreover, a stamping process, not removing material as far as removable peripheral areas are concerned, does not provide a required accuracy in the context of permanent adhesive bonding, because the die-stamping must be performed on a totally adhesive-free area or else undesired conducting areas shall remain stuck around the antenna coil. On the other hand, the use of non-permanent adhesive bonding and the tearing of removable areas make it probably even more difficult than before to achieve a sufficiently precise pattern layout and to keep the conducting areas apart from each other prior to the application of a dielectric.

The method as set forth in the claims combines the precision and reliability obtained by etching and laser evaporation, yet in such a way that for example the mid-portion of an RFID tag need not be removed by etching or evaporating. Not a single of the above-cited prior art publications describes combining a material-removing pattern layout with a selective conductive layer attachment in such a way that undesired extensive areas would be released by removing material from around them.

By virtue of the selective attachment of a conductive layer, it is also possible to provide for example fuse configurations, connecting wires or breaking conductors. Through the hole can be constructed reliable penetrations, such that the strain of a conductive layer upon forcing it through the hole can be controlled by means of the selective adhesive bonding and the conductor's pattern layout. This enables making a penetration in a simple manner even in a thick laminate by way of a small penetration hole.

The release of extensive areas provides a considerable saving of working time in a laser vaporization process and at the same time enables the use of for example paper as a substrate material, and in a wet etching process, the consumption of an etching solution is reduced, with the manufacturing time and expenses also being reduced.

A method of the invention enables the production of objects with coil antennas by using laser vaporization in a manner highly beneficial with respect to the prior art. Because a laser is capable of producing a very precise conductor pattern also on paper and, on the other hand, the precisely defined adhesive bond, applied according to the invention with an ink-jet technique, provides the same design with a void mid-region which is released in the form of a strip by vaporizing with a laser along the peripheral area of the adhesive bonding. This enables producing a conductive pattern on almost any arbitrary type of substrate material.

Further, as opposed to techniques presented in the cited references, the presently claimed technology is based on combining techniques currently in industrial use. Therefore, it can be put to service more readily than the technology described in the above-cited publications.

Especially stamping has proved difficult to carry out in conducted tests, and the bending of a circuit in two directions for applying the dielectric reliably inside the cuts proved to be at least challenging, even in the case of a single handcrafted object. A method of the invention enables manufacturing RFID tags in an economically viable manner also with a laser, because the amount of material to be removed is a fraction of what it used to be.

Laser, in turn, enables the use of paper or fabric as a substrate material. In this case, some adhesive components may also vaporize through the substrate material or the setting may also rely on the effect of air, whereby the useful bonding agents may comprise many vaporizing or air-setting materials and solvent-based adhesives, which are poorly suitable for interconnecting gas-impermeable plastics and metal with high accuracy and quickly. This facilitates for example the use of an ink-jet technique, because the final setting of a liquid adhesive need not occur in a gas-impervious space, nor is it necessary to wait for the evaporation of solvents before the metal foil can be pressed in place. Thus, it is also possible to use a water-soluble adhesive without a significant deceleration of production. A completed paper laminate can be impregnated throughout for example with plastics and/or cast or laminated within plastics, the resulting end product being mechanically and chemically durable. A non-stretch fabric of silk type, for example a fiberglass tissue, enables also gluing by pressing through the fabric.

What is claimed is:

1. A laminate, containing conductive circuit patterns, a substrate material, and a first adhesive pattern or other bond, or a part of laminate, wherein
    i) each conductive circuit pattern and the substrate material are interconnected by the first adhesive pattern or other bond, having its size and shape matching the main outlines of each conductive circuit pattern, an edge of the first adhesive pattern or other bond being not more distant from an edge of each conductive circuit pattern than twice a diameter of a laser beam used for patterning the main outlines of each conductive circuit pattern,
    ii) each conductive circuit pattern has at least one area, gap, or interline space, wherein, on top of the first adhesive pattern or other bond, conductive material in direct contact with the first adhesive pattern or other bond has been removed by a laser beam, such that the first adhesive pattern or other bond still extends at least to an edge of the remaining conductive material and the at least one area, gap, or interline space may have residues of the first adhesive pattern or other bond, and
    iii) outside the conductive circuit patterns' main outlines, there are areas where the substrate material is void of the first adhesive pattern or other bond.

2. The laminate as set forth in claim 1, further comprising a second adhesive pattern or other bond and an additional layer, which is affixed to the substrate material by the second adhesive pattern or other bond in such a way that the additional layer's lamination with the substrate material and the conductive circuit patterns is void of the first adhesive pattern or other bond connecting each conductive circuit pattern to the substrate material, with the possible exception of areas where conductive material has been removed by a laser beam.

3. The laminate as set forth in claim 1, wherein the laminate has the substrate material provided with at least one hole or with an area present at the edge of the laminate, and at least two conductive layers are interconnected electrically, by the hole or the edge area, for establishing an electrical contact between the at least two conductive layers.

* * * * *